United States Patent [19]

Otremba

[11] 3,943,450

[45] Mar. 9, 1976

[54] FREQUENCY CONVERTING DEVICE FOR RF SIGNALS

[75] Inventor: Klaus Otremba, Munich, Germany

[73] Assignee: Siemens Aktiengesellschaft, Berlin & Munich, Germany

[22] Filed: Aug. 19, 1974

[21] Appl. No.: 498,605

[30] Foreign Application Priority Data

Aug. 23, 1973 Germany.........................2342671

[52] U.S. Cl. ................................................ 325/446
[51] Int. Cl.² ............................................ H04B 1/26
[58] Field of Search ........... 325/430, 434, 439, 442, 325/445, 446; 321/61, 65, 69 W; 333/84 M

[56] References Cited
UNITED STATES PATENTS

| | | | |
|---|---|---|---|
| 2,951,149 | 8/1960 | Grieg et al. | 325/445 |
| 2,961,531 | 11/1960 | Howe | 325/445 |
| 3,310,748 | 3/1967 | Putnam | 325/446 |
| 3,584,306 | 6/1971 | Spacek | 325/446 |
| 3,659,206 | 4/1972 | Hallford | 325/446 |
| 3,711,778 | 1/1973 | Day | 325/446 |

*Primary Examiner*—George H. Libman
*Assistant Examiner*—Jin F. Ng
*Attorney, Agent, or Firm*—Hill, Gross, Simpson, Van Santen, Steadman, Chiara & Simpson

[57] ABSTRACT

A frequency converting or mixing device for a receiver, particularly employing hollow conductor or micro strip techniques, including signal and oscillator input means, a diode as a non-linear element, an intermediate frequency output and two stub circuits at the signal input side of the diode, at a mutual distance of approximately one-fourth signal input wave length, for effecting a blocking of currents, of the second harmonic of the oscillator frequency and the summation frequency of the signal input frequency and oscillator frequency, at the diode.

12 Claims, 2 Drawing Figures

1

FREQUENCY CONVERTING DEVICE FOR RF SIGNALS

BACKGROUND OF THE INVENTION

The invention is directed to a frequency converting device, i.e. a mixer for RF signals at receiver or the like, of the type employing signal and oscillator input means, a diode as a non-linear element and an intermediate frequency output, in which blocking circuits are provided in the vicinity of the diode for oscillations of the second harmonic of the oscillator frequency as well as the summation frequency of the oscillator frequency and the signal frequency.

An arrangement of this type is, for example, illustrated in U.S. Pat. No. 3,659,206. In such an arrangement, the currents of the undesired oscillations are isolated from the rest of the circuit by a blocking circuit on both sides of the diode.

The invention is directed to the problem of producing a frequency converting device, of the type referred to, which exhibits as small as possible a reflection factor at the signal and carrier input means, and where a termination reflector is involved has as low a noise figure as possible.

A BRIEF SUMMARY OF THE INVENTION

The problem referred to is solved, in accordance with the invention by this provision at the signal input side of the diode, of two filter circuits disposed at a mutual distance of approximately one-fourth of the signal input wave length, i.e. ($\lambda/4$) which are operative to block the currents of the second harmonic of the oscillator frequency and summation frequency of the received signal for input frequency and the oscillator frequency, with respect to the diode.

Study has shown that, within the scope of the invention, a very small noise factor of the frequency converting device is achievable if the current flow for the frequencies $2 f_{LO}$, i.e. the second harmonic of the local oscillator and the frequency $f_{S+LO}$, i.e. the summation frequency of the received input signal frequency and the oscillator frequency, is blocked at the diode. As a result of the measures according to the invention, namely the special, transforming filter circuits, in the direct proximity of the diode, the current for the mentioned frequencies is interrupted in such a way that an unlimited large impedance is transformed at the diode.

In the application of the invention to a frequency converting device for a receiver utilizing hollow conductor technique, whereby the diode is inserted in a coaxial line section extending transversely to the hollow conductor, the blocking filters, preferably constructed in the form of two radially extending lines, each with a radial length of approximately ($\lambda/4$), are disposed at the signal input side of the diode, whereby one filter is disposed directly at the diode and the second is disposed at a distance of approximately ($\lambda/4$) from the first.

Where the invention is employed in a frequency converting device for a receiver involving strip line technique, whereby the diode is inserted in a laminated circuit plate as the like, the blocking filters preferably are formed as two stub lines, of approximately ($\lambda/4$) in length, which are disposed on the signal input side of the diode at a distance of approximately ($\lambda/4$) from the diode and a mutual distance of approximately ($\lambda/4$).

In a further embodiment of the invention for a frequency converting device in micro strip technique, a hybrid circulating or signal ring may be employed as the coupling element, provided with two oppositely disposed inputs to which the input signal frequency and the oscillator frequency are respectively connected, and in which the two oppositely disposed outputs are provided with respective line branches, each of which contains a diode, which are circuited in parallel on the output side. Each of such line branches contains two blocking filters, each of which is designed as a stub line of approximately ($\lambda/4$) in length, disposed at the signal input side of the associated diode, with the first filter, in each case, being spaced a distance of approximately ($\lambda/4$) from the diode and the two filters having a mutual spacing of approximately ($\lambda/4$).

In a further preferred development of this embodiment of the invention, along the line branches containing the diodes, at least approximately in the vicinity opposite to the stub lines ground line sections are provided which form conductive paths through the circuit board, and further there may be provided, at the circumference of the signal ring, stub lines whose lengths are small in comparison to that of the operating wave length.

By suitable dimensioning of the radial or stub lines, respectively constituting the filter circuits, the current interruption, resulting from the presence of the filter circuits for the respective frequencies, is assured over a larger frequency range, and at the same time a suitable matching is effected with respect to the diodes.

BRIEF DESCRIPTION OF THE DRAWINGS

In the drawings wherein like reference characters indicate like or corresponding parts.

DETAILED DESCRIPTION OF THE INVENTION

Figure 1:
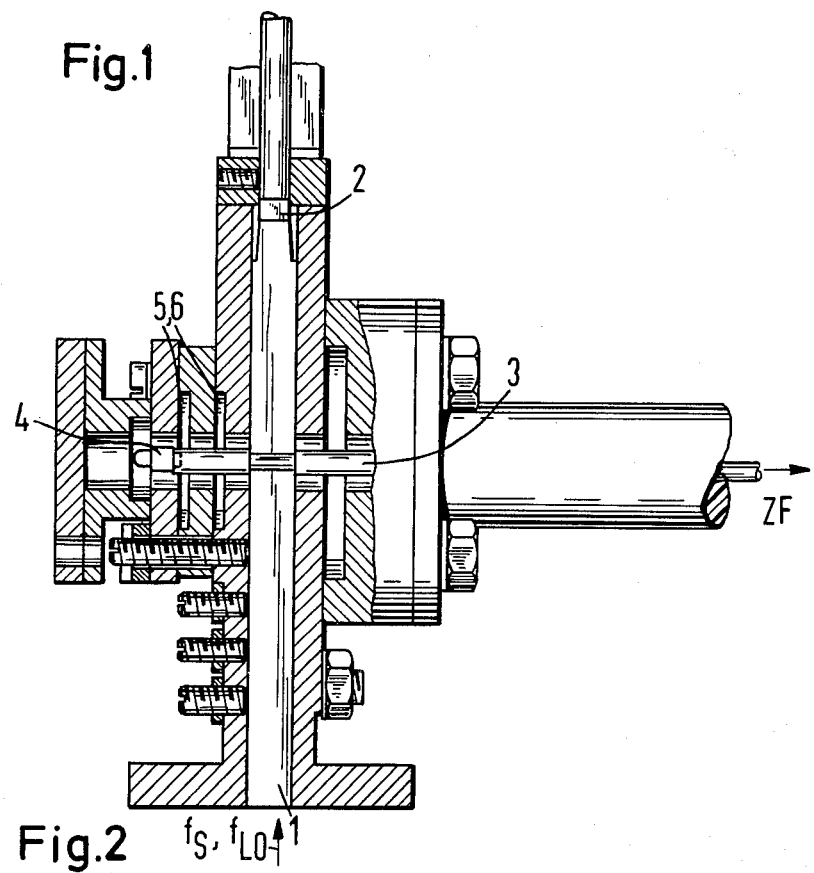
FIG. 1 illustrates a frequency converting device for a receiver employing hollow conductor technique, with part of the converting device shown in section.

Referring to FIG. 1, there is illustrated a frequency converting device, employing hollow conductor technique, in which the coupling elements for the signal input frequency, and the oscillator frequency, for example circulators or directional couplers, are not illustrated. The received input signal of the frequency $f_S$, and the frequency $f_{LO}$ of the local oscillator, are suitably directed to the adjacent end of a hollow conductor 1, the opposite end of which is terminated by a shorting plunger 2. A coaxial conductor, with an inner conductor 3, is arranged transversely to the hollow conductor 1 with the diode 4 being inserted into a line section terminating in a hollow conductor side wall, and which line section, at the opposite side of the hollow conductor, forms the intermediate frequency output ZF of the frequency converting device of the receiver. In the immediate proximity of the diode 4, on the side of the signal input 2, radially extending lines 5, 6 are disposed which form the blocking filters for the currents of the two-fold oscillator frequency $2 f_{LO}$, and the summation frequency of the received input signal frequency and the oscillator frequency ($f_S + f_{LO}$). The two radially extending lines 5 and 6 each have a radial length of approximately ($\lambda/4$), with one of the lines being directly connected to the diode 4 and the second of the lines disposed at a distance of approximately ($\lambda/4$) with respect to the first line. By means of such transforming filter circuits, in the form of radially extending lines 5 and 6, an infinite impedance is transformed to the diode for currents of the second harmonic of the oscillator frequency and the summation frequency derived from the signal input frequency and the oscillator frequency, so that these currents are interrupted at the diode.

Figure 2:
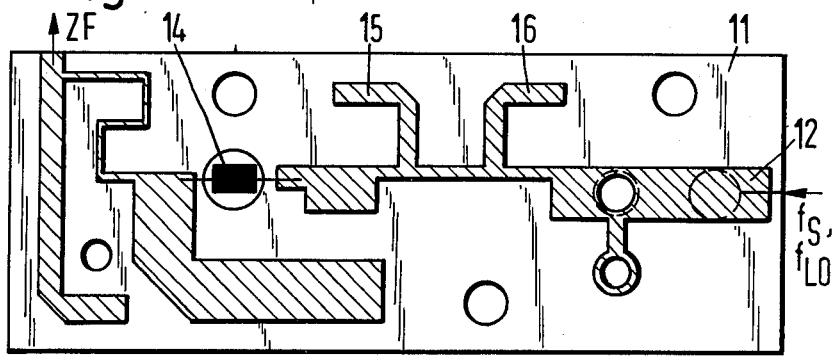
FIG. 2 is a semi-diagramatic plan view of a frequency converting device for a receiver in micro strip technique.

FIG. 2 illustrates a frequency converting device for a receiver involving micro strip technique, with the coupling elements for the signal input frequency and the frequency of the local oscillator likewise not being illustrated. In this embodiment, the circuit elements are applied by printing techniques to a laminated conductor plate 11. The conductor path 12 at the right side of the figure forms the input for the received input signal having a frequency $f_S$, and for the signal of the local oscillator having the frequency $f_{LO}$. Disposed along the conductor path 12 are two stub lines 15, 16 which are arranged in the form of lateral branches. Such two stub lines 15, 16, which are spaced apart a distance of approximately ($\lambda/4$) and are each approximately ($\lambda/4$) in length, constitute the blocking filters for the frequencies $2f_{LO}$ (second harmonic of the oscillator frequency) and $f_{LO + S}$ (summation frequency). The diode 14 is inserted into a bore or opening in the conducting plate 11, disposed in the conductor path, with the diode being spaced from the stub line 15 by a distance of approximately ($\lambda/4$). The intermediate frequency output ZF is, in this construction, located at the upper left corner of the conductor plate 11. Additional conductor paths on the laminated conductor plate 11, which do not directly involve the subject matter of the invention, are not illustrated in detail.

Figure 3:
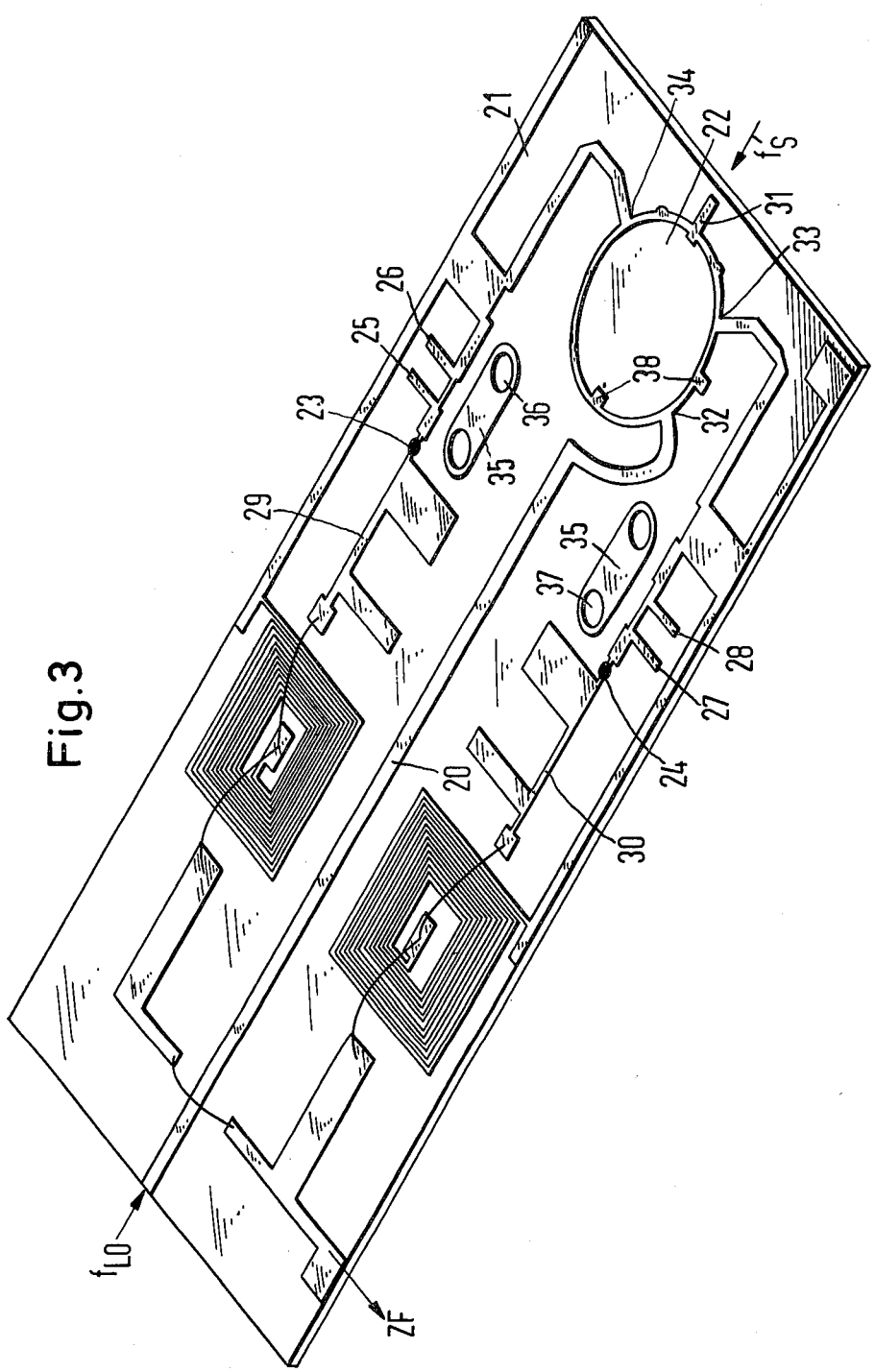
FIG. 3 is an isometric view of a further embodiment of the invention employing micro strip technique.

FIG. 3 illustrates a further embodiment of the invention in connection with fabrication in micro strip technique. In this construction a hybrid signal ring 22 is provided having an input 31, at the end appearing at the right in FIG. 3, to which the received input signal having the frequency $f_S$ is supplied. A further input 32, displaced by approximately 120° from the input 31, is operatively connected to the local oscillator frequency $f_{LO}$ by the centrally disposed conductor 22.

Between the two input arms 31, 32 of the ring 22 are two additional arms 33, 34 which are respectively connected to line branches 29, 30 containing respective diodes 23 and 24, which are connected in parallel at the output side, whereby the common output ZF forms the intermediate frequency output. In accordance with the invention there are provided two stub lines, 25, 26 in the line 29 and two similar stub lines 27, 28 in the line 30, each of which stub lines have a length of approximately ($\lambda/4$). The stub lines 25, and 27, adjacent the respective diodes 23 and 24, are each spaced from their associated diode by a distance of approximately ($\lambda/4$) and the adjacent stub lines 25, 26 and 27, 28 are spaced from one another by a distance of approximately ($\lambda/4$).

In this arrangement, as in the previous arrangements, the special transforming filter circuits in the direct proximity of the diodes are operative to interrupt the currents for the respective frequencies whereby at the diode chip an infinite impedance is transformed.

Line sections 35, 35' are provided along the respective line branches 29, 30 containing the diodes 23, 24, approximately in the area located opposite to the respective stub lines 25, 26 or 27, 28 respectively, for effecting connection to the ground lamination on the bottom of the conductor plate 21, by means of the connecting through-contacts 36, 37 whereby a good electrical connection between the line sections 35, 35' and the ground lamination is provided and good electrical isolation between the individual conductor paths is assured. For the precision adjustment of the signal ring 22, a capacitive load is provided comprising stub lines 38, located at the circumference of the ring, which lines each have a length that is small in comparison to the operating wave length. By suitable dimensioning of the filter circuits, and a corresponding dimensioning of the width of the radial or stub lines respectively, the previously mentioned current interruption is assured over a larger frequency range and the diodes simultaneously are suitably matched.

Although particular embodiments of the invention have been described and illustrated herein, it is recognized that modifications and variations may readily occur to those skilled in the art and consequently it is intended that the claims be interpreted to cover all such modifications and equivalents.

I claim:

1. In a frequency converting device for a receiver, particularly in hollow conductor, strip line and micro strip techniques, including signal and oscillator input means, a diode as a non-linear element, an input line connecting said input means and said diode, an intermediate frequency output, and blocking circuits in the proximity of the diode for oscillations of the second harmonic of the oscillator frequency as well as the summation frequency of the oscillator frequency and the signal frequency, said blocking circuits comprising a pair of filter elements, each having a length of approximately ($\lambda/4$) connected to the input line, said elements being spaced a distance of approximately ($\lambda/4$) apart, for effecting a current blockage of currents of the second harmonic of the oscillator frequency and the summation frequency of the signal frequency and oscillator frequency, at the diode.

2. A frequency converting device according to claim 1, for a receiver fabricated in hollow conductor technique, in which the diode is inserted into a coaxial line section arranged transverse to the hollow conductor, wherein said filter elements are in the form of two radially extending lines disposed on the signal input side of the diode, said lines each having a radial length of approximately ($\lambda/4$), one of such lines being disposed directly at the diode and the second at a distance of approximately ($\lambda/4$) from the first line.

3. A frequency converting device according to claim 2, wherein the radial lines comprising the filter circuits have dimensions such that the current interruption resulting from such filter circuits for the respective frequencies is achieved over a greater frequency range.

4. A frequency converting device according to claim 1, for a receiver in strip line technique, in which the diode is inserted into a laminated circuit board, wherein said filter elements are designed as two stub lines each approximately ($\lambda/4$) in length, disposed on the signal input side of the diode at a distance of approximately ($\lambda/4$) from the diode and the distance between the two lines being approximately ($\lambda/4$).

5. A frequency converting device according to claim 4, wherein the stub lines comprising the filter circuits have dimensions such that the current interruption resulting from such filter circuits for the respective frequencies is achieved over a greater frequency range.

6. A frequency converting device according to claim 1, for a receiver, in micro strip technique, comprising a hybrid signal ring as a coupling element, having two oppositely disposed inputs to which the input signal and the oscillator frequency are respectively connected, and having two oppositely disposed outputs to which are connected respective line branches, each branch contains a said diode and a pair of said filter elements, said diodes being connected in parallel at their output sides, wherein the two blocking filters, in the form of stub lines each having a length of approximately ($\lambda/4$), are disposed at the signal input side of the respective diodes, in each case at a distance of approximately ($\lambda/4$) from the associated diode.

7. A frequency converting device according to claim 6, wherein, at the circumference of the signal ring, there are connected stub lines whose lengths are short as compared to the operating wave length.

8. A frequency converting device according to claim 6, wherein the stub lines comprising the filter circuits have dimensions such that the current interruption resulting from such filter circuits for the respective frequencies is achieved over a greater frequency range.

9. A frequency converting device according to claim 6, wherein, line sections are located adjacent the line brances containing the diodes, which line sections are provided for the ground lamination and are contacted therewith.

10. A frequency converting device according to claim 9, wherein, at the circumference of the signal ring, there are connected stub lines whose lengths are short as compared to the operating wave length.

11. A frequency converting device according to claim 9, wherein said line sections are located opposite the portions of the line branches to which the respective pairs of stub lines are connected.

12. A frequency converting device according to claim 11, wherein, at the circumference of the signal ring, there are connected stub lines whose lengths are short as compared to the operating wave length.

* * * * *